United States Patent
Araki et al.

(10) Patent No.: US 7,640,650 B2
(45) Date of Patent: Jan. 5, 2010

(54) METHOD OF MAKING A MAGNETORESISTIVE READER STRUCTURE

(75) Inventors: Satoru Araki, San Jose, CA (US); Ying Hong, Morgan Hill, CA (US); Wipul Jayasekara, Los Gatos, CA (US); Ming Jiang, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/965,867

(22) Filed: Dec. 28, 2007

(65) Prior Publication Data

US 2009/0168253 A1   Jul. 2, 2009

(51) Int. Cl.
G11B 5/127   (2006.01)
H04R 31/00   (2006.01)
G11B 5/33   (2006.01)

(52) U.S. Cl. ............. 29/603.12; 29/603.13; 29/603.14; 29/603.15; 360/322; 257/414

(58) Field of Classification Search .............. 29/603.12, 29/603.13, 603.14, 603.16, 603.18; 360/319, 360/328, 322; 257/414
See application file for complete search history.

(56) References Cited

U.S. PATENT DOCUMENTS

| | | | |
|---|---|---|---|
| 6,700,759 B1 * | 3/2004 | Knapp et al. ............. | 360/324.2 |
| 6,744,608 B1 | 6/2004 | Sin et al. | |
| 6,787,369 B2 | 9/2004 | Ishii et al. | |
| 6,858,909 B2 * | 2/2005 | Cyrille et al. ............. | 257/414 |
| 6,995,960 B2 | 2/2006 | Seyama et al. | |
| 7,134,185 B1 | 11/2006 | Knapp et al. | |
| 2004/0084400 A1 | 5/2004 | Costrini et al. | |
| 2005/0158882 A1 | 7/2005 | Hwang et al. | |
| 2006/0279882 A1 | 12/2006 | Honda et al. | |
| 2006/0292705 A1 | 12/2006 | Hegde et al. | |
| 2007/0026538 A1 | 2/2007 | Jayasekara | |
| 2007/0274011 A1 * | 11/2007 | Ohta et al. ............. | 360/328 |

FOREIGN PATENT DOCUMENTS

JP   2003298150   10/2003

OTHER PUBLICATIONS

Bryan Oliver et al., "Dielectric Breakdown in Magnetic Tunnel Junctions Having an Ultrathin Barrier", Journal of Applied Physics, vol. 91, No. 7, Apr. 1, 2002, pp. 4348-4352.

T. Niizeki et al. "Nanofabrication of Magnetic Tunnel Junctions by Using Side-Edge Thin Film Deposition", Science and Technology of Advanced Materials 4 (2003), pp. 347-352.

* cited by examiner

Primary Examiner—A. Dexter Tugbang
Assistant Examiner—David P Angwin
(74) Attorney, Agent, or Firm—Patterson & Sheridan, L.L.P.

(57) ABSTRACT

A method of making a magnetoresistive sensor includes defining a track width of a magnetoresistive element stack of the sensor. Further, processes of the method enable depositing of hard magnetic bias material on each side of the stack. These processes may permit both milling of excess depositions of the material outside of regions where the hard magnetic bias material is desired via use of a photoresist and making the material have a planar surface via chemical mechanical polishing, which also removes the material on top of the stack. The method includes removing excess material outside of the photoresist, wherein the excess material includes part of the hard bias layer, while a portion of the hard bias layer remains directly above the MR sensor stack.

22 Claims, 6 Drawing Sheets

METHOD OF MAKING A MAGNETORESISTIVE READER STRUCTURE

BACKGROUND OF THE INVENTION

1. Field of the Invention

Embodiments of the invention generally relate to methods of making a magnetoresistive reader structure for sensing data stored on magnetic media.

2. Description of the Related Art

In an electronic data storage and retrieval system, a magnetic head typically includes a reader portion having a magnetoresistive (MR) sensor for retrieving magnetically encoded information stored on a magnetic recording medium or disk. The MR sensor includes multiple layers and operates based on a change of resistance of the MR sensor in the presence of a magnetic field. During a read operation, a bias current is passed through the MR sensor. Magnetic flux emanating from a surface of the recording medium causes rotation of a magnetization vector of a sensing or free layer of the MR sensor, which in turn causes the change in resistance of the MR sensor. The change in resistance of the read element is detected by passing a sense current through the read element, and then measuring the change in bias voltage across the read element to generate a read signal. This signal can then be converted and manipulated by an external circuitry as necessary. A hard magnetic bias structure can be used to stabilize the magnetic movement of the free layer to provide a noise-free response from the MR sensor. In construction of the MR sensor, depositing hard bias layers on both sides of the MR sensor accomplishes this stabilization.

As storage density on the recording medium increases, a track width of the MR sensor must be made narrower to enable accurate read sensitivity. Signal resolution depends on the track width of the MR sensor being narrower than track spacing on the recording medium. Several prior approaches for defining the track width of the MR sensor exist but have disadvantages. For example, material deposited to form the hard magnetic bias structure may remain above the MR sensor without any ability to be lifted off due to a photoresist lacking sufficient thickness as a result of its poor mill resistance at small track width. Further, attempts to remove unwanted portions of the hard magnetic bias structure tend to create unevenness or thinning of the hard magnetic bias structure and thereby prevent proper stabilization during use.

Therefore, there exists a need for processes of fabricating narrow magnetoresistive sensors to improve properties of the sensors.

SUMMARY OF THE INVENTION

In one embodiment, a method of forming a magnetoresistive (MR) read sensor includes providing a MR sensor stack within a dielectric and removing a portion of the MR sensor stack and the dielectric to define a track width of the MR read sensor. Depositing a hard bias layer on both sides of the MR sensor stack fills voids defined by the portion removed. Applying a photoresist above the hard bias layer and over the MR sensor stack facilitates removing excess material of the hard bias layer outside of the photoresist. Chemical mechanical polish (CMP) may then be used to remove the hard bias material on top of the track width region and to planarize the hard bias layer.

For one embodiment, a method of forming a MR read sensor includes providing a bottom shield with a MR sensor stack deposited on the bottom shield. Depositing a hard bias layer fills wells on each side of the MR sensor stack. Removing excess material of the hard bias layer utilizes a photoresist above the hard bias layer to protect areas of the hard bias layer that require relatively less material removal.

A method according to one embodiment forms a MR read sensor by depositing a polish resistant hard mask layer on a read sensor stack and developing a first photoresist patterned on the hard mask layer such that reactive ion etching removes the mask layer where the photoresist is patterned prior to removing the first photoresist. Ion milling the read sensor stack that is unprotected by the mask layer except where a track width is defined occurs prior to depositing a hard bias layer on both sides of the read sensor stack where the ion milling left voids. Next, patterning a second photoresist on the hard bias layer such that the remaining photo resist film is only at selected areas enables additional milling of unprotected regions of the hard bias layer outside of the second photoresist to remove excess material of hard bias layer. Further, chemical mechanical polishing the hard bias layer planarizes the hard bias layer that remains and removes hard bias layer on top of the sensor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

Embodiments of the invention relate to methods of making a magnetoresistive sensor. The method includes defining a track width of a magnetoresistive element stack of the sensor. Further, processes of the method enable depositing of hard magnetic bias material on each side of the stack. These processes may permit both milling of excess depositions of the material outside of regions where the hard magnetic bias material is desired via use of a photoresist and making the material have a planar surface via chemical mechanical polishing, which also removes the unwanted material on top of the sensor stack.

Figure 1:
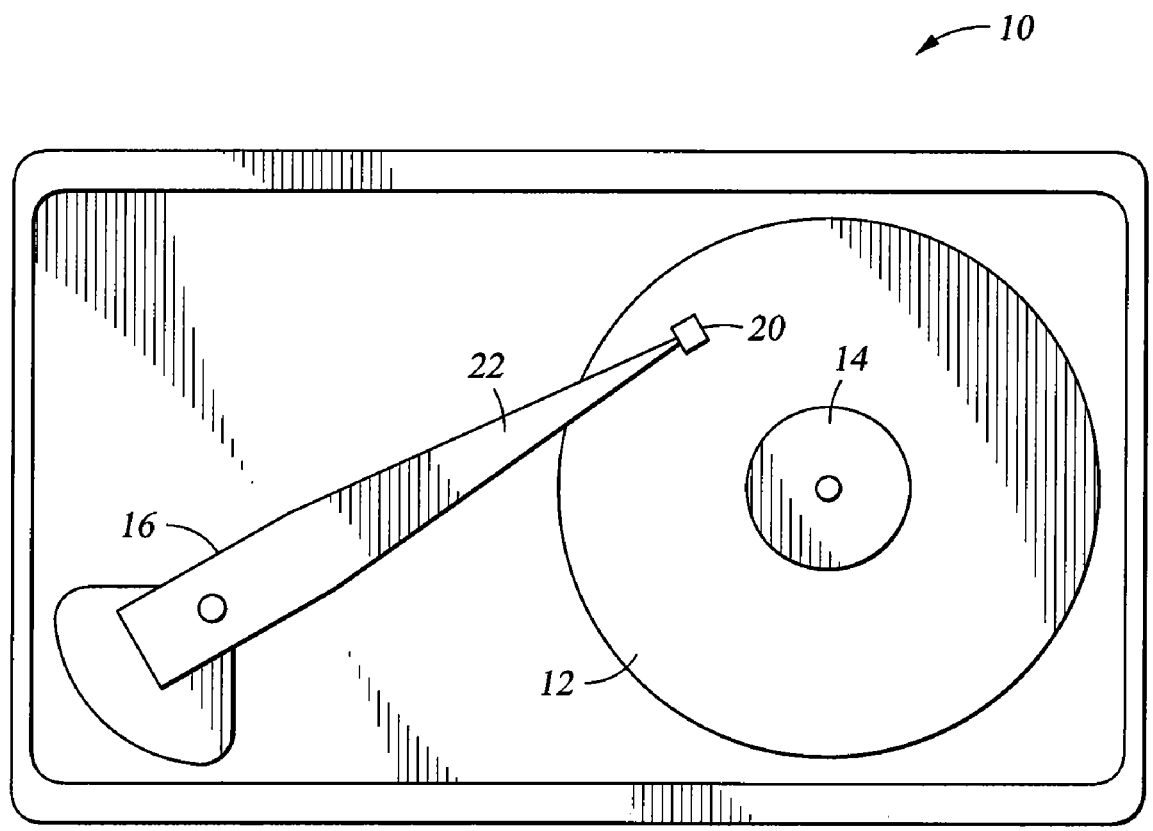
FIG. 1 is a top plan view of a hard disk drive including a magnetic head, according to embodiments of the invention.

FIG. 1 illustrates a hard disk drive 10 that includes a magnetic media hard disk 12 mounted upon a motorized spindle 14. An actuator arm 16 is pivotally mounted within the hard disk drive 10 with a magnetic head 20 disposed upon a distal end 22 of the actuator arm 16. During operation of the hard disk drive 10, the hard disk 12 rotates upon the spindle 14 and the magnetic head 20 acts as an air bearing slider adapted for flying above the surface of the disk 12. As described hereinafter, the magnetic head 20 includes a substrate base upon which various layers and structures that form the magnetic head 20 are fabricated. Thus, magnetic heads disclosed herein can be fabricated in large quantities upon a substrate and subsequently sliced into discrete magnetic heads for use in devices such as the hard drive 10.

A read portion of the magnetic head 20 includes a read sensor between a bottom shield and a top shield. For some embodiments, the read sensor is a giant magnetoresistive (GMR) sensor or a tunnel magnetoresistive (TMR) sensor, is either a current-in-plane (CIP) or current-perpendicular-to-plane (CPP) type and has a plurality of magnetic and non-magnetic layers (hereinafter "MR element stack" depicted schematically by reference number 200 in FIGS. 2-9). A magnetic hard bias layer 500 (shown in FIGS. 5-9) of the read sensor provides a longitudinal magnetic bias to align a ferromagnetic free layer of the MR element stack 200 in a single domain state. The following describes in detail a method of producing this read sensor of the magnetic head 20.

Figure 2:
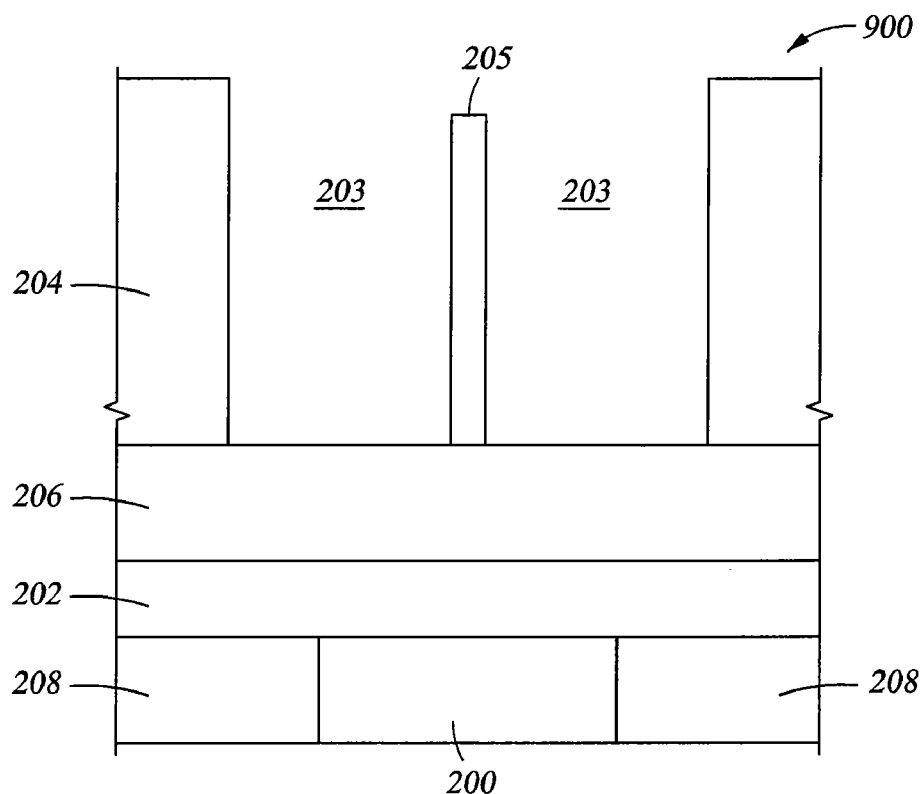
FIG. 2 is a cross-sectional view of a partially completed structure that when finished forms the read element of the magnetic head and includes, at a stage depicted, a read sensor stack, a hard mask layer above the read sensor stack, and a patterned first photoresist above the hard mask layer, according to embodiments of the invention.
Figure 8:
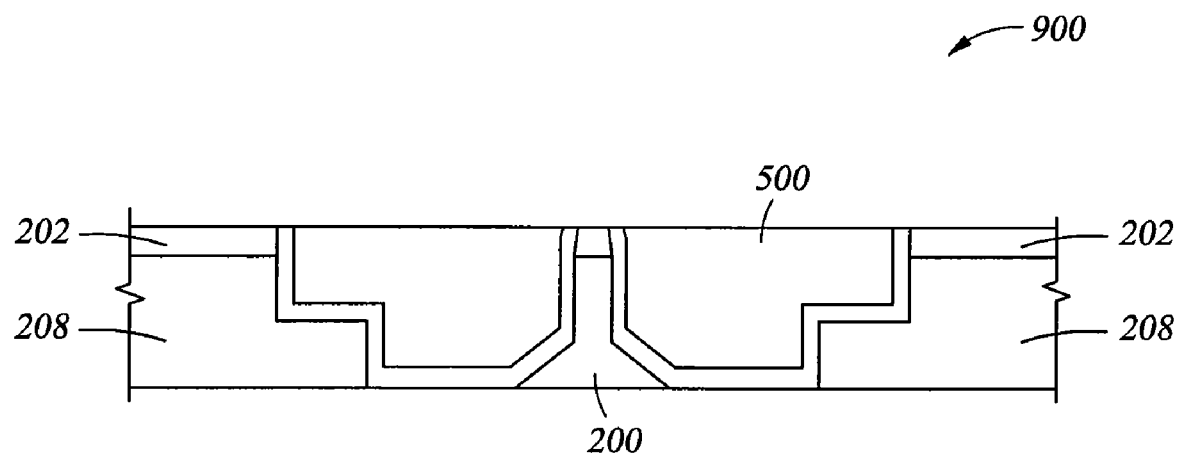
FIG. 8 is a cross-sectional diagrammatic view of the structure following chemical mechanical polishing (CMP) of the insulation and hard bias layers remaining, according to embodiments of the invention.
Figure 9:
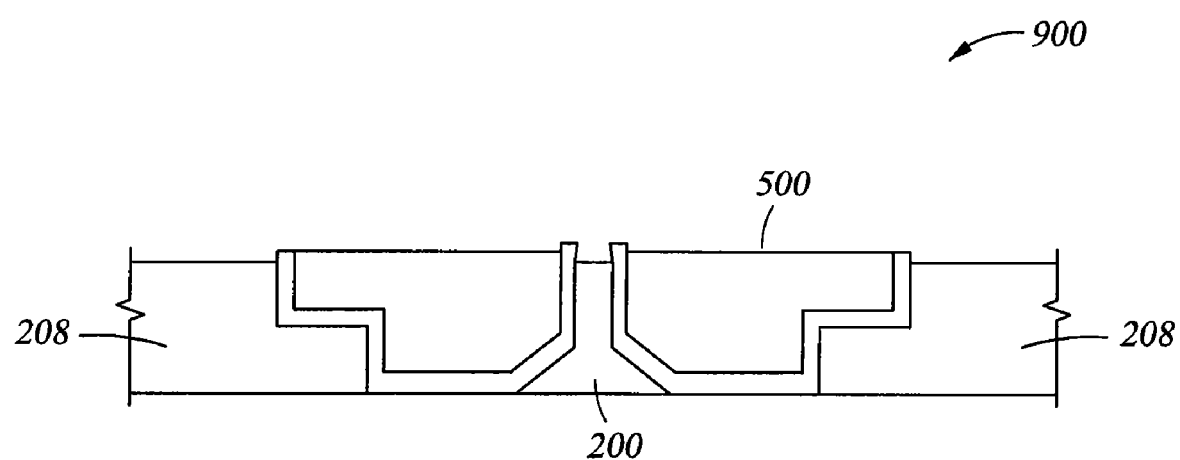
FIG. 9 is a cross-sectional diagrammatic view of the structure with formation of the insulation and hard bias layers on both sides of the read sensor stack and completed by performing RIE to remove the mask layer that remains, according to embodiments of the invention.

FIG. 2 shows a structure 900 that is partially completed and that when finished (as shown in FIG. 9) forms part of the read sensor of the magnetic head 20. FIGS. 3-9 illustrate several succeeding stages shown in order to depict manufacturing progression of the structure 900. At a stage depicted in FIG. 2, the structure 900 includes the MR element stack 200, a hard mask layer 202 deposited above the MR element stack 200, and a patterned first photoresist 204 above the hard mask layer 202. A base dielectric material 208 fills in on each side of the MR element stack 200 and is also covered by the hard mask layer 202. Both the base dielectric material 208 and the MR element stack 200 may be formed above the bottom shield. For some embodiments, lithography with the first photoresist 204 may further include an anti-reflection layer 206 between the hard mask layer 202 and the first photoresist 204.

A narrow feature 205 of the first photoresist 204 remains above the MR element stack 200 that is otherwise not covered by the first photoresist 204. The narrow feature 205 may occupy a width of 40 nanometers (nm) or less. This width of the narrow feature 205 provides the magnetic head 20 with a corresponding track width of 40 nm or less. Patterning of the first photoresist 204 provides voids 203 within the first photoresist 204 on each side of the narrow feature 205. In some embodiments, the first photoresist 204 contains silicon and provides mill resistance.

Figure 3:
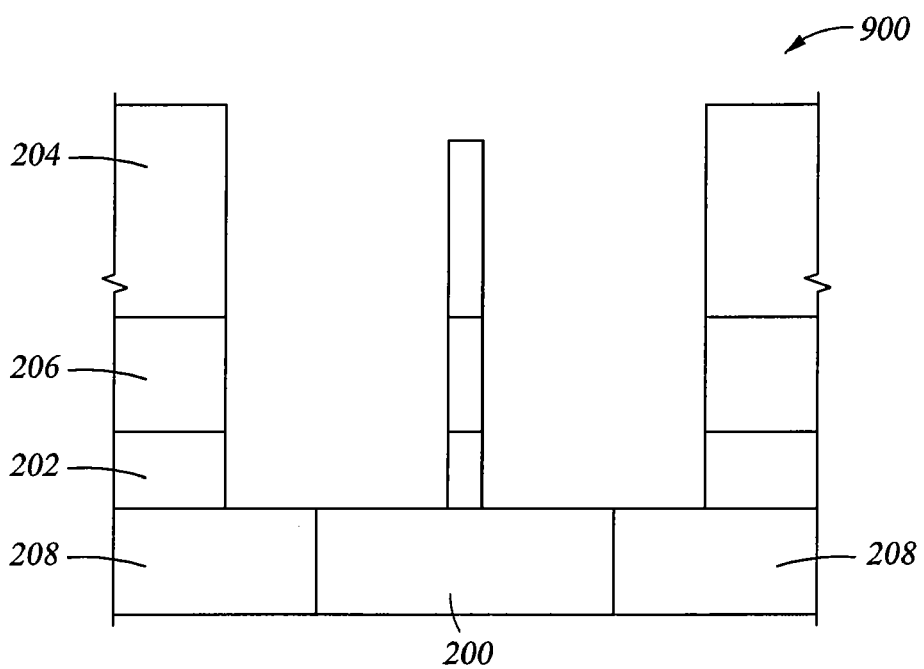
FIG. 3 is a cross-sectional diagrammatic view of the structure, at one of several succeeding stages shown in order herein to depict manufacturing progression, after reactive ion etching (RIE) the hard mask layer, according to embodiments of the invention.

FIG. 3 illustrates the structure 900 after reactive ion etching (RIE) the hard mask layer 202. The RIE removes the hard mask layer 202 where the voids 203 are within the first photoresist 204. For some embodiments, the hard mask layer 202 includes diamond like carbon (DLC) with a thickness of about 30 nm. Further, composite structures may form the hard mask layer 202, such as silicon oxide ($SiO_2$) and DLC (e.g., each 20 nm thick), silicon nitride ($Si_3N_4$) and DLC (e.g., each 20 nm thick), tantalum oxide (TaO) and DLC (e.g., each 20 nm thick), tantalum and DLC (e.g., 30 nm and 10 nm thick, respectively), alumina and DLC (e.g., each 20 nm thick), or alumina, tantalum oxide and DLC (e.g., 20 nm, 2 nm and 20 nm thick, respectively). Regardless of composition of the hard mask layer 202, characteristics of the hard mask layer 202 include capability to act as a mill mask, a hardness sufficient to function as a chemical mechanical polishing (CMP) stop (i.e., a lower CMP rate than hard bias materials), and ability to be removed by RIE alone or with ion milling when alumina is present in the hard mask layer 202.

Figure 4:
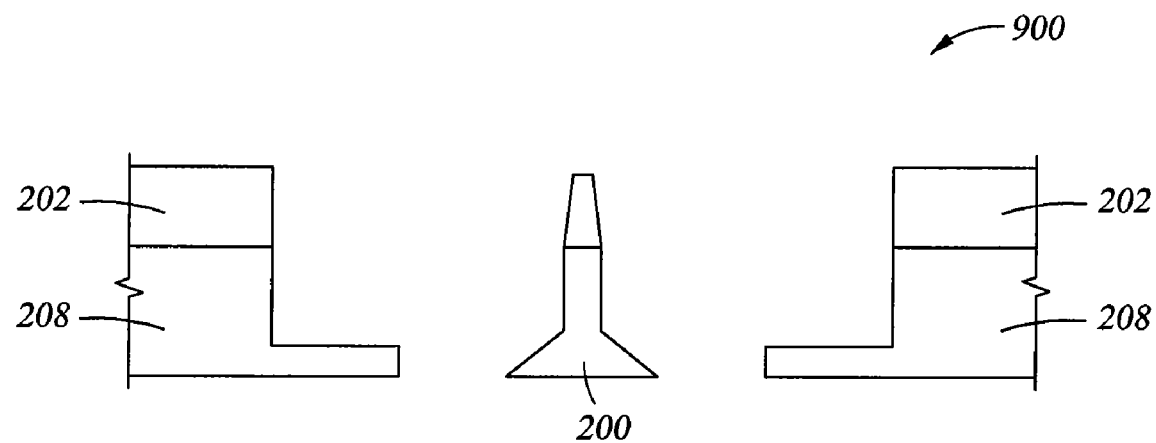
FIG. 4 is a cross-sectional diagrammatic view of the structure post ion milling of the read sensor stack to define a track width of the magnetic read element, according to embodiments of the invention.

FIG. 4 shows the structure 900 post ion milling of the MR element stack 200 to define the track width. The ion milling mills through at least part of the MR element stack 200 and the base dielectric material 208 where not protected by the hard mask layer 202. In addition, removing of the first photoresist 204 and, if present, the anti-reflection layer 206 occurs before or after the ion milling. Stripping of the first photoresist 204 in some embodiments utilizes a chemical or other process to strip off the first photoresist 204 from the hard mask layer 202.

Figure 5:
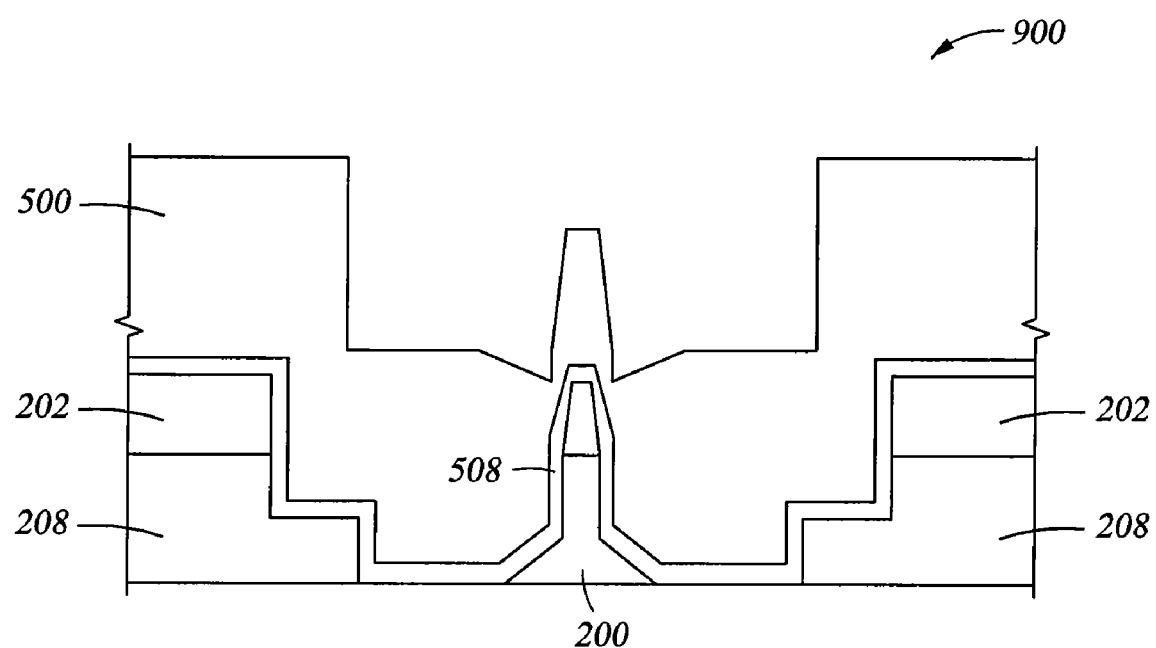
FIG. 5 is a cross-sectional diagrammatic view of the structure upon depositing an insulation layer and a hard bias layer on both sides of the read sensor stack, according to embodiments of the invention.

FIG. 5 illustrates the structure 900 upon depositing an insulating layer 508 and the hard bias layer 500 on both sides of the MR element stack 200. The insulating layer 508 of alumina, for example, separates the MR element stack 200 from the hard bias layer 500. For some embodiments, the hard bias layer 500 can be deposited adjacent to the stack 200 without the insulating layer 508 that is optional, such as when the stack 200 is used for a CIP reader instead of a TMR/CPP sensor application. An atomic layer deposition or other deposition methods form the insulating layer 508 prior to deposition of the hard bias layer 500. Topography of the hard bias layer 500 varies across the structure 900 and includes peaks in areas where the hard bias layer 500 is unwanted or at least where relatively greater thickness of the hard bias layer 500 is to be removed. Thickness of the hard bias layer 500 enables utilizing CMP procedures described below to planarize the hard bias layer 500 and the ability to provide final thickness of the hard bias layer 500 as desired within a range that may vary from 10 nm to 30 nm, for example. In some embodiments, selection of the deposition produces the hard bias layer 500 that is deposited between 40 nm and 60 nm thick.

Figure 6:
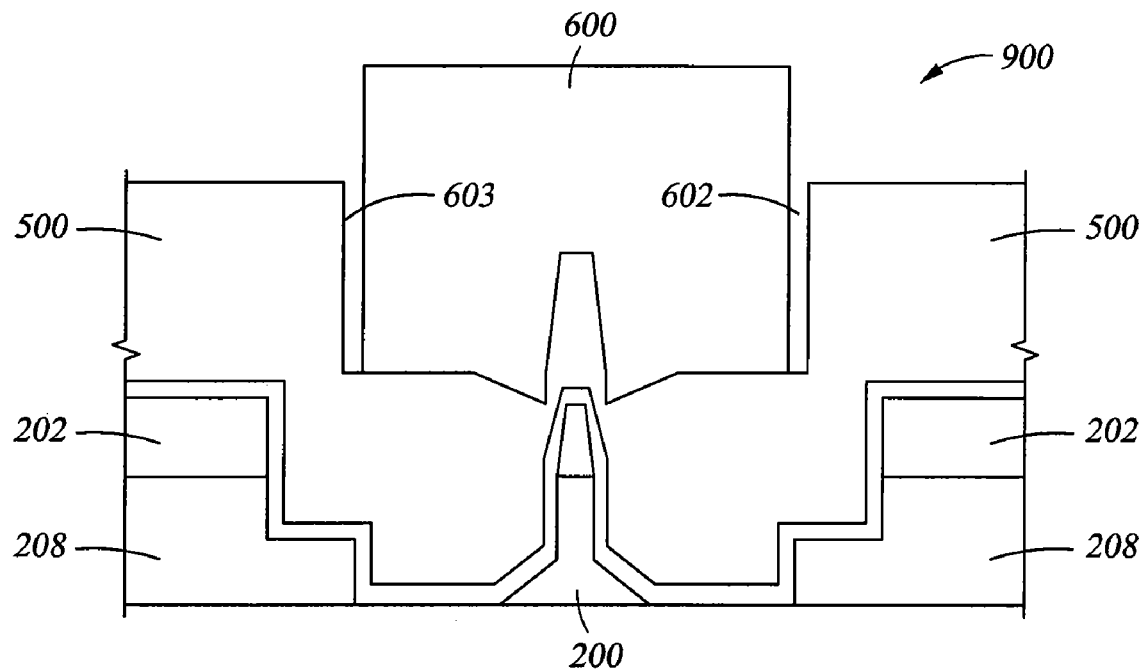
FIG. 6 is a cross-sectional diagrammatic view of the structure subsequent to protecting a sensor region and adjacent hard bias regions with a second photoresist patterned on the hard bias layer, according to embodiments of the invention.

FIG. 6 shows the structure 900 subsequent to protecting the sensor region and adjacent hard bias regions with a second photoresist 600 patterned on the hard bias layer 500. The second photoresist 600 is above all of the MR element stack 200 corresponding to the sensor region and above where the hard bias layer 500 remains on each side of the MR element stack 200 when the structure 900 is completed. For process tolerance purposes, width of the second photoresist 600 may be selected such that the second photoresist 600 does not extend all the way across where the hard bias layer 500 is to remain. For example, a gap 602 may exist between the second photoresist 600 and ridges 603 formed by the hard bias layer 500 transitioning from being disposed where milling of the hard mask layer 202 occurred to above the hard mask layer 202 located on each side of the MR element stack 200. In some embodiments, the second photoresist 600 is 250 nm, 500 nm, or 800 nm inside of the hard mask layer 202 located on each side of the MR element stack 200.

To achieve planarization with good uniformity and without complications such as dishing and scratch, the insulation and hard bias material 500 outside of the second photoresist 600 requires removal compared to that protected by the second photoresist 600. The second photoresist 600 provides mill resistance. Further, the second photoresist 600 covers a large area relative to the narrow feature 205 required to be patterned with the first photoresist 204, which as a result does not necessarily need to be the same as the second photoresist 600.

Figure 7:
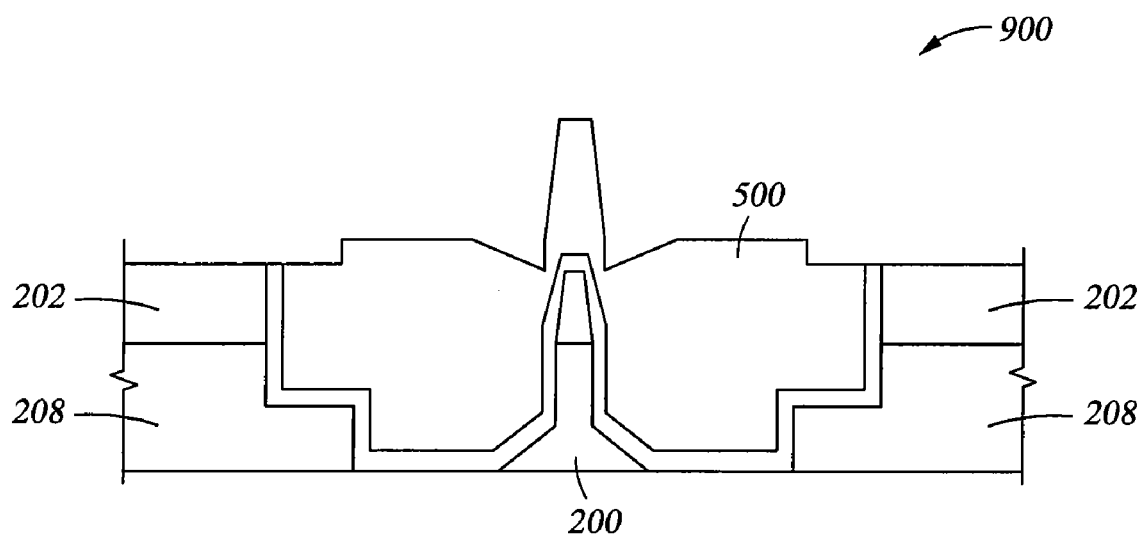
FIG. 7 is a cross-sectional diagrammatic view of the structure after ion milling unprotected regions of the hard bias layer outside of the second photoresist and then stripping off the second photoresist, according to embodiments of the invention.

FIG. 7 illustrates the structure 900 after ion milling unprotected regions of the insulating and hard bias layers outside of the second photoresist 600. Reaching the hard mask layer 202 identifies an end point for the milling. Stripping off the second photoresist 600 occurs once the end point is reached.

FIG. 8 shows the structure 900 following a CMP procedure that planarizes the hard bias layer 500 remaining. The CMP completely removes the insulating and hard bias layers above the MR element stack 200. The hard mask layer 202 provides a stop for the CMP.

FIG. 9 illustrates the structure 900 completed by performing RIE to remove the hard mask layer 202 that remains. As shown in FIG. 9, the structure 900 provides a final configuration for the MR element stack 200 and the hard bias layer 500. While the structure is completed with respect to formation of the MR element stack 200 and the hard bias layer 500, the structure 900 may undergo subsequent processing to further complete the magnetic head 20 that the structure 900 is ready to be integrated into by, for example, deposition of a top lead and plating of the top shield.

Figure 10:
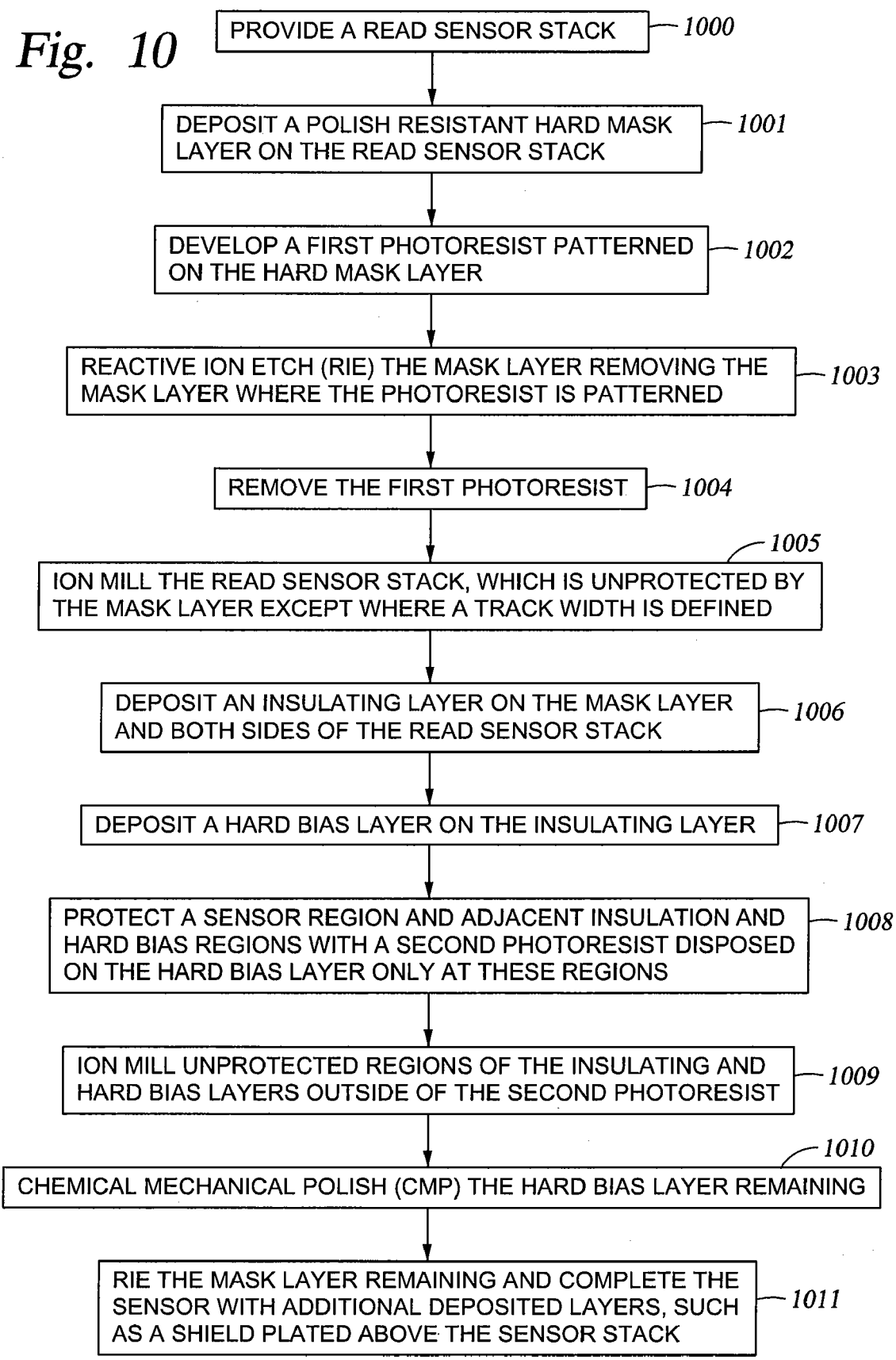
FIG. 10 is a flow chart illustrating a method of making the structure depicted in FIGS. 2-9, according to embodiments of the invention.

FIG. 10 shows a flow chart for a method of making the structure depicted in FIGS. 2-9. The method includes providing a read sensor stack (step 1000) and depositing a polish resistant hard mask layer on the read sensor stack (step 1001). Developing a first photoresist patterned on the hard mask layer (step 1002) facilitates reactive ion etching the mask layer to remove the mask layer where the photoresist is patterned (step 1003). Thereafter, the first photoresist is removed (step 1004). Ion milling the read sensor stack that is unprotected by the mask layer except where a track width is defined (step 1005) occurs prior to depositing an insulating layer on the hard mask and both sides of the read sensor stack (step 1006).

Next, depositing a hard bias layer on the insulation material fills in on both sides of the read sensor stack where milling left voids (step 1007). Patterning a photoresist on the hard bias layer only at selected areas protects the sensor region and adjacent hard bias regions (step 1008). Ion milling unprotected regions of the insulating and hard bias layers outside of the second photoresist removes excess material of the insulating and hard bias layers (step 1009). Subsequently, chemical mechanical polishing the hard bias layer planarizes the hard bias layer remaining (step 1010). Another reactive ion etch removes the mask layer remaining and completes the structure (step 1011).

While the foregoing is directed to embodiments of the present invention, other and further embodiments of the invention may be devised without departing from the basic scope thereof, and the scope thereof is determined by the claims that follow.

What is claimed is:

1. A method of forming a magnetoresistive (MR) read sensor, comprising:
   providing a MR sensor stack within a dielectric;
   removing a portion of the MR sensor stack and the dielectric to define a track width of the MR read sensor;
   depositing a hard bias layer on both sides of the MR sensor stack within voids defined by the portion removed;
   applying a photoresist above the hard bias layer and over the MR sensor stack; and
   removing excess material outside of the photoresist, wherein the excess material includes part of the hard bias layer, while a portion of the hard bias layer remains directly above the MR sensor stack.

2. The method of claim 1, further comprising chemical mechanical polishing the hard bias layer after removing the excess material.

3. The method of claim 1, further comprising:
   depositing a hard mask layer above the MR sensor stack;
   patterning by photo exposure a film above the hard mask layer; and
   removing the hard mask layer where the film is patterned to thereby enable removing the portion unprotected by the hard mask layer.

4. The method of claim 3, wherein the hard mask layer comprises diamond like carbon.

5. The method of claim 3, wherein removing the hard mask layer where the film is patterned comprises reactive ion etching.

6. The method of claim 3, further comprising reactive ion etching the hard mask layer to remove all of the hard mask layer after chemical mechanical polishing of the hard bias layer.

7. The method of claim 3, further comprising lifting off the film prior to depositing the hard bias layer.

8. The method of claim 1, wherein removing the excess material comprises ion milling.

9. The method of claim 1, wherein removing the portion comprises ion milling.

10. The method of claim 1, wherein the photoresist is patterned to be inside of a dimension corresponding to outer boundaries of the portion removed.

11. The method of claim 10, wherein the photoresist is patterned to be about 250 nanometers inside of the dimension.

12. A method of forming a magnetoresistive (MR) read sensor, comprising:
   providing a MR sensor stack within a dielectric;
   removing a portion of the MR sensor stack and the dielectric to define a track width of the MR read sensor;

depositing a hard bias layer on both sides of the MR sensor stack within voids defined by the portion removed;

applying a photoresist above the hard bias layer and over the MR sensor stack;

removing excess material outside of the photoresist, wherein the excess material includes part of the hard bias layer; and depositing an insulation layer on a hard mask above the MR sensor stack and on both sides of the MR sensor stack, wherein the hard bias layer is deposited on top of the insulation layer and fills the voids and the excess material removed includes part of the insulation layer.

13. The method of claim 12, further comprising chemical mechanical polishing the hard bias layer after removing the excess material.

14. The method of claim 12, further comprising:

depositing a hard mask layer above the MR sensor stack;

patterning by photo exposure a film above the hard mask layer; and removing the hard mask layer where the film is patterned to thereby enable removing the portion unprotected by the hard mask layer.

15. The method of claim 14, wherein the hard mask layer comprises diamond like carbon.

16. The method of claim 14, wherein removing the hard mask layer where the film is patterned comprises reactive ion etching.

17. The method of claim 14, further comprising reactive ion etching the hard mask layer to remove all of the hard mask layer after chemical mechanical polishing of the hard bias layer.

18. The method of claim 14, further comprising lifting off the film prior to depositing the hard bias layer.

19. The method of claim 12, wherein removing the excess material comprises ion milling.

20. The method of claim 12, wherein removing the portion comprises ion milling.

21. The method of claim 12, wherein the photoresist is patterned to be inside of a dimension corresponding to outer boundaries of the portion removed.

22. The method of claim 21, wherein the photoresist is patterned to be about 250 nanometers inside of the dimension.

* * * * *